(12) United States Patent
Tang et al.

(10) Patent No.: US 11,466,361 B2
(45) Date of Patent: *Oct. 11, 2022

(54) METHOD OF PREPARING HYDRATED CALCIUM SILICATE NANO-FILM

(71) Applicant: Wuhan University, Wuhan (CN)

(72) Inventors: Shengwen Tang, Wuhan (CN); Hubao A, Wuhan (CN); Wenzhi Yu, Wuhan (CN); Wei Zhou, Wuhan (CN); Jingtao Chen, Wuhan (CN); Zhen He, Wuhan (CN)

(73) Assignee: WUHAN UNIVERSITY, Wuhan (CN)

( * ) Notice: Subject to any disclaimer, the term of this patent is extended or adjusted under 35 U.S.C. 154(b) by 614 days.

This patent is subject to a terminal disclaimer.

(21) Appl. No.: 16/522,696

(22) Filed: Jul. 26, 2019

(65) Prior Publication Data

US 2020/0208256 A1 Jul. 2, 2020

(30) Foreign Application Priority Data

Dec. 26, 2018 (CN) .......................... 201811598296.6

(51) Int. Cl.
*C23C 14/35* (2006.01)
*C23C 14/34* (2006.01)
(Continued)

(52) U.S. Cl.
CPC .............. *C23C 14/35* (2013.01); *B22F 1/142* (2022.01); *C23C 14/082* (2013.01); *C23C 14/10* (2013.01);
(Continued)

(58) Field of Classification Search
CPC ....... C23C 14/35; C23C 14/082; C23C 14/10; C23C 14/3414; C23C 14/5846;
(Continued)

(56) References Cited

U.S. PATENT DOCUMENTS 11,254,612 B2 * 2/2022 Tang ....................... C23C 14/10
2014/0216921 A1 * 8/2014 Zelner ................. C23C 14/3414
241/3

FOREIGN PATENT DOCUMENTS

KR 101412319 B1 * 6/2014

OTHER PUBLICATIONS

KR101412319B1 Translation (Year: 2014).*
(Continued)

*Primary Examiner* — Jennifer Wecker
*Assistant Examiner* — Patrick S Ott
(74) *Attorney, Agent, or Firm* — Matthias Scholl P.C.; Matthias Scholl

(57) ABSTRACT

A method of preparing a hydrated calcium silicate (C—S—H) nano-film. The method includes: 1) synthesizing a hydrated calcium silicate powder having a calcium to silicon ratio (Ca/Si) of 0.5-3.0; 2) calcining the C—S—H powder obtained in 1) for 2-3 hours under a temperature of 150-250° C., cooling to approximately 25° C., and pressing the C—S—H powder under a pressure of 100-200 megapascal, to yield a target material; 3) fixing a substrate on a sample table of a magnetron sputtering apparatus, placing the target material obtained in 2) in a target position of the magnetron sputtering apparatus, pre-sputtering the target material for 5-10 minutes, rotating the substrate at a constant speed, sputtering the target material for 30-300 minutes, to yield a nano-film; and 4) soaking the nano-film obtained in 3) into in a saturated aqueous solution of calcium hydroxide at approximately 25° C. for 1-3 days.

5 Claims, 5 Drawing Sheets

(51) Int. Cl.
  *B22F 1/142*  (2022.01)
  *C23C 14/58*  (2006.01)
  *C23C 14/10*  (2006.01)
  *C23C 14/08*  (2006.01)
  *H01J 37/34*  (2006.01)
  *B82Y 30/00*  (2011.01)
  *B82Y 40/00*  (2011.01)

(52) U.S. Cl.
  CPC ...... *C23C 14/3414* (2013.01); *C23C 14/5846* (2013.01); *H01J 37/3405* (2013.01); *B22F 2201/12* (2013.01); *B22F 2202/05* (2013.01); *B22F 2302/45* (2013.01); *B82Y 30/00* (2013.01); *B82Y 40/00* (2013.01); *H01J 2237/332* (2013.01)

(58) Field of Classification Search
  CPC ....... C23C 14/06; C23C 14/542; B22F 1/142; B22F 2201/12; B22F 2205/05; B22F 2302/45; H01J 37/3405; H01J 2237/332; B82Y 30/00; B82Y 40/00
  See application file for complete search history.

(56) References Cited

OTHER PUBLICATIONS

Lu, et al., Synthesis of freestanding single-crystal perovskite films and heterostructures by etching of sacrificial water-soluble layers, 2016, Nature Materials, 15, 1255-1261 (Year: 2016).*

Chen, et al., Green synthesis of calcium silicate bioceramic powders, 2015, Ceramics International, 41, 5445-5453 (Year: 2015).*

* cited by examiner

METHOD OF PREPARING HYDRATED CALCIUM SILICATE NANO-FILM

CROSS-REFERENCE TO RELATED APPLICATIONS

Pursuant to 35 U.S.C.§ 119 and the Paris Convention Treaty, this application claims foreign priority to Chinese Patent Application No. 201811598296.6 filed Dec. 26, 2018, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to the technical field of inorganic materials, and more particularly to a method of preparing a hydrated calcium silicate (C—S—H) nano-film.

Cement is one of the most widely used building materials. The most important hydration product of cement is C—S—H.

Because cement-based materials fail from microscale to macroscale, it is urgent to study the properties of C—S—H on the microscale.

Nano-films are commonly used to investigate the properties of material on microscale. Currently, there are several methods to prepare nano-films, such as physical vapor deposition method (PVD) and chemical vapor deposition method (CVD).

Magnetron sputtering that can be used to prepare uniform and dense nano-films and it is one of the PVD methods that has been widely applied to nano-film deposition and surface coating. So far, there have been no reports of using magnetron sputtering method to prepare nano-films of cement-based materials.

SUMMARY

The disclosure provides a method of preparing a C—S—H nano-film that can be used to observe structures and measure properties of C—S—H on a micro scale conveniently.

The method comprises:
1) synthesizing a hydrated calcium silicate (C—S—H) powder having a calcium to silicon ratio (Ca/Si) of 0.5-3.0;
2) calcining the C—S—H powder obtained in 1) for 2-3 hours under a temperature of 150-250° C., cooling to approximately 25° C., and pressing the C—S—H powder under a pressure of 100-200 megapascal, to yield a target material having a diameter of between 50 and 60 mm and a thickness of between 4 and 6 mm;
3) fixing a substrate on a sample table of a magnetron sputtering apparatus, placing the target material obtained in 2) in a target position of the magnetron sputtering apparatus, maintaining a relative distance between the substrate and the target material to 2-10 cm; evacuating a sputtering chamber of the magnetron sputtering apparatus to a pressure of not more than $10^{-3}$ pascal, injecting argon or helium to the sputtering chamber, wherein a flow rate of the argon or helium is controlled to be 10-100 sccm to keep the pressure in the sputtering chamber at 0.5-2.5 pascal; setting a magnetron sputtering power to 50-200 W, pre-sputtering the target material for 5-10 minutes, turning on a rotation system of the sample table and rotating the substrate at a constant speed, sputtering the target material for 30-300 minutes, to yield a nano-film;
4) soaking the nano-film obtained in 3) into in a saturated aqueous solution of calcium hydroxide at approximately 25° C. for 1-3 days, to yield a hydrated calcium silicate nano-film.

The C—S—H powder in 1) has a formula of $(CaO)x.SiO_2.H_2O$, in which x ranges from 0.5 to 3.0.

In 2), the C—S—H powder is calcined under a temperature of 200° C. for 2.5 hours.

In 2), the C—S—H powder is pressed under a pressure of 150 megapascal to yield the target material; in 3), the substrate comprises glass, silicon, metal or metal oxide; the relative distance between the substrate and the target material is 5 cm; the flow rate of the argon or helium is 50 sccm; the pressure of the sputtering chamber is 1.5 pascal; the magnetron sputtering power is 150 W; a pre-sputtering time of the target material is 8 minutes; and a sputtering time of the target material is 150 minutes.

In 4), the nano-film prepared in 4) is immersed in the saturated aqueous solution of calcium hydroxide at 25° C. for 2 days.

Compared with the existing methods, advantages of the method according to embodiments of the disclosure are summarized as follows:

(1) The size of the prepared C—S—H nano-film is controllable: the thickness of the film can be controlled by adjusting the sputtering power, sputtering time, the distance between the substrate and the target, and the size of the substrate can be changed to prepare a C—S—H nano-film of a desired size.

(2) The purity and uniformity of the nano-film is effectively ensured: the film is prepared by magnetron sputtering without introducing impurities and the deposition rate of the C—S—H on the substrate is controllable.

(3) The preparation process is economical: the magnetron sputtering apparatus has been widely used, and the sputtering process does not require complicated method and expensive instruments or equipment.

(4) The method can be implemented by using conventional magnetron sputtering devices, so it is easy to popularize.

(5) The C—S—H nano-film prepared by this method can be conveniently used for subsequent experiments, including morphology observation and micromechanical performance testing.

DETAILED DESCRIPTION

Figure 1:
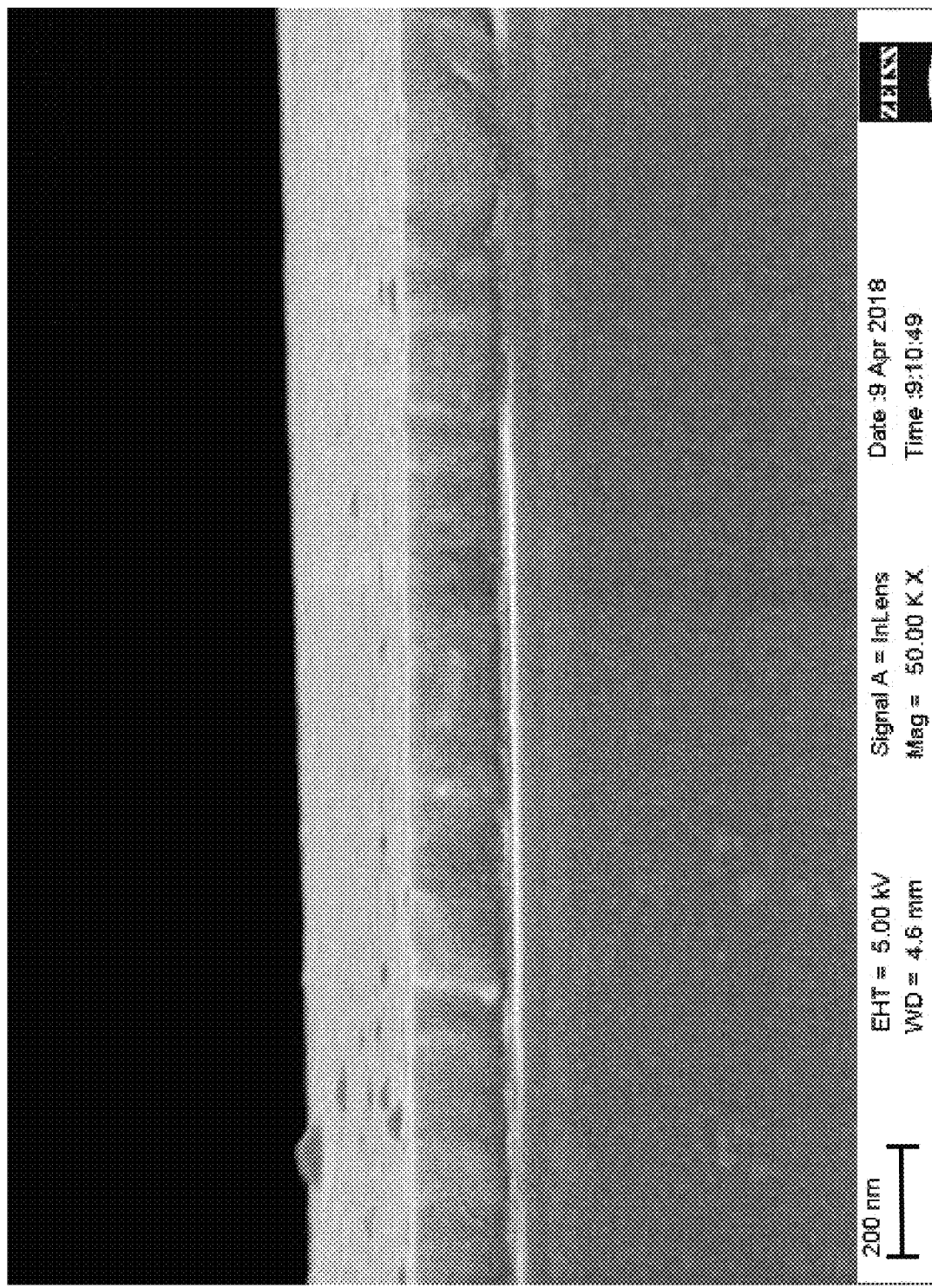
FIG. 1 is a SEM image of cross-section of a C—S—H nano-film in Example 1 (the thickness of the nano-film is not marked) of the disclosure.
Figure 2:
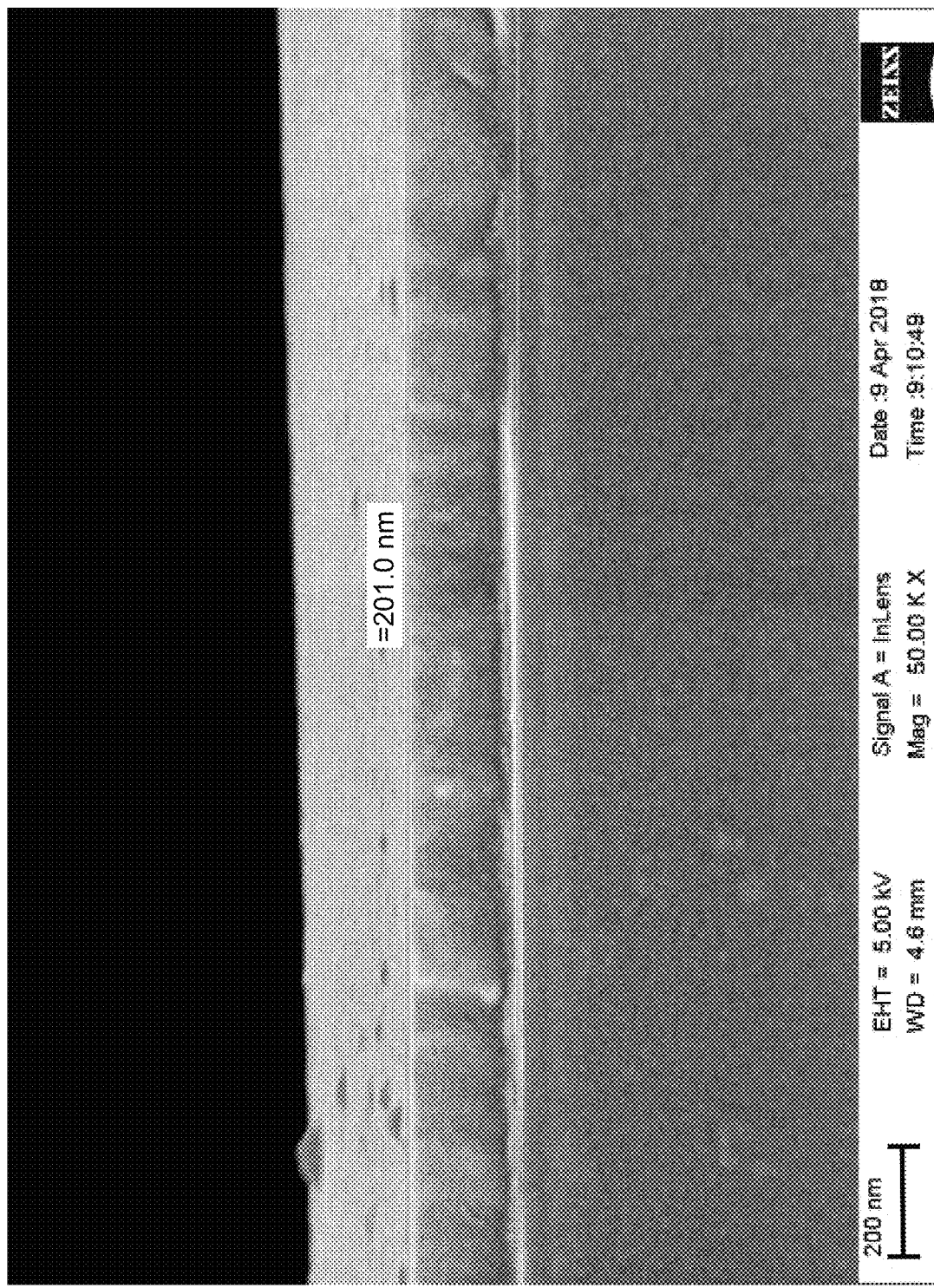
FIG. 2 is a SEM image of cross-section of a C—S—H nano-film in Example 1 (the thickness of the nano-film is marked) of the disclosure.
Figure 3:
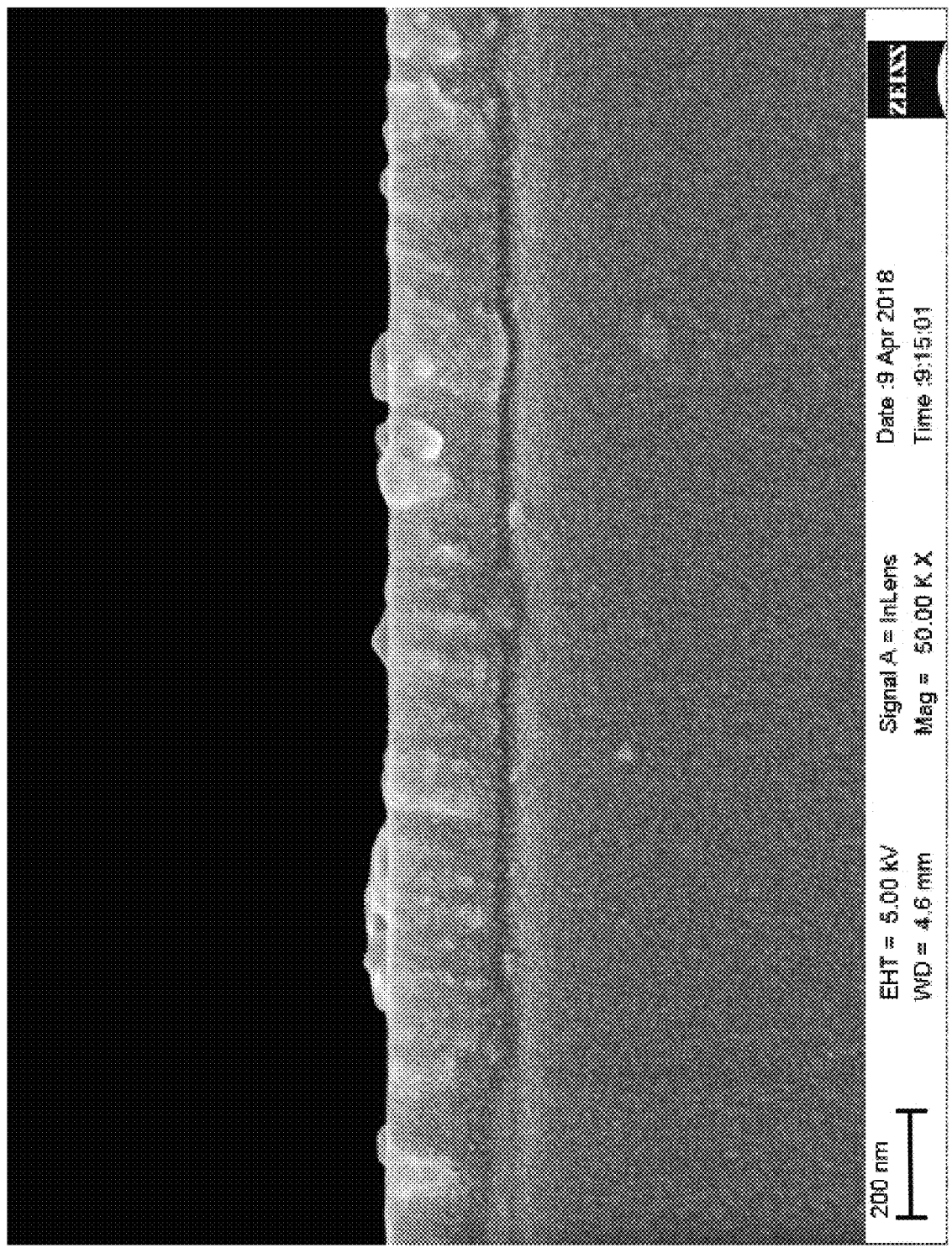
FIG. 3 is a SEM image of cross-section of a C—S—H nano-film in Example 2 (the thickness of the nano-film is not marked) of the disclosure.
Figure 4:
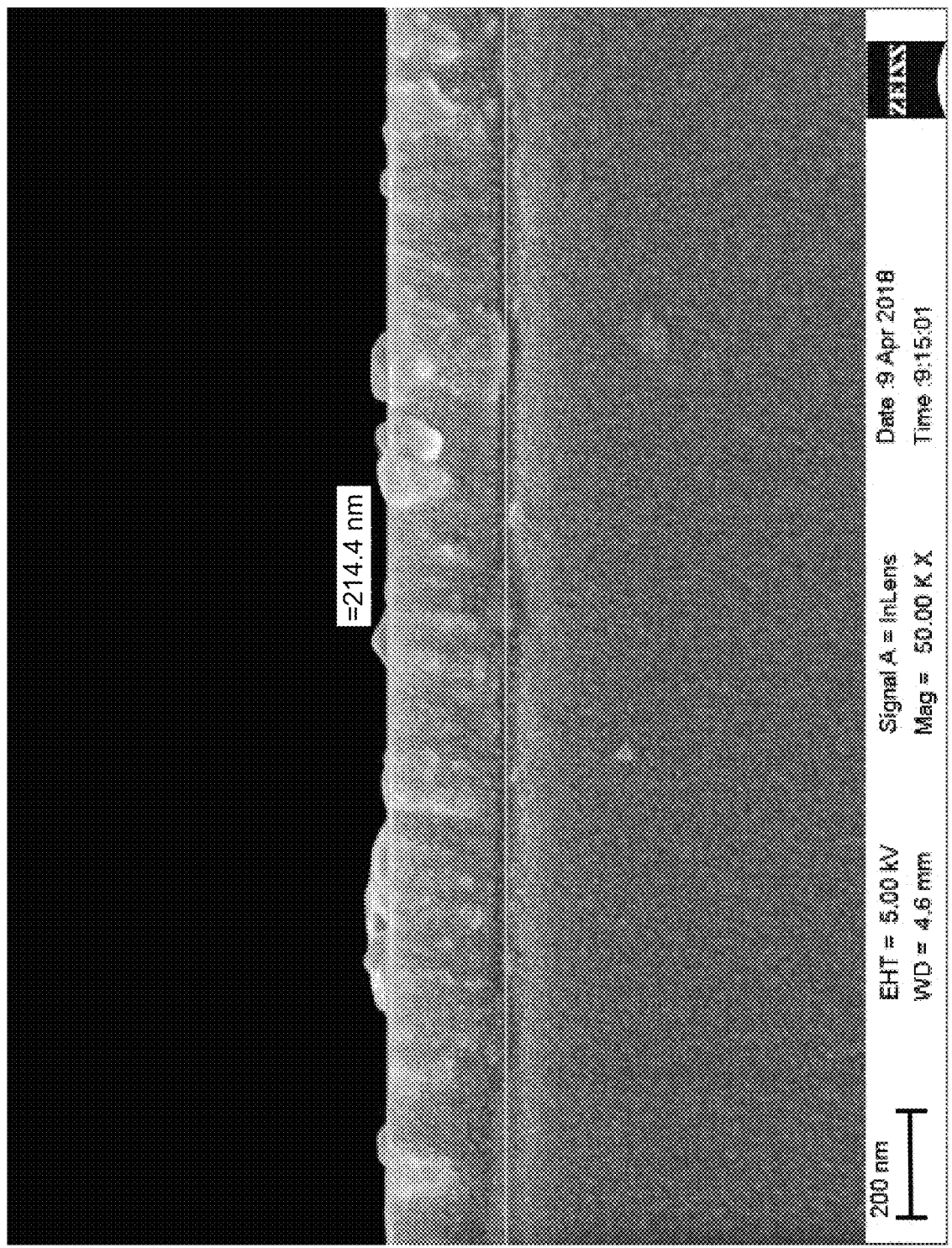
FIG. 4 is a SEM image of cross-section of a C—S—H nano-film in Example 2 (the thickness of the nano-film is marked) of the disclosure.
Figure 5:
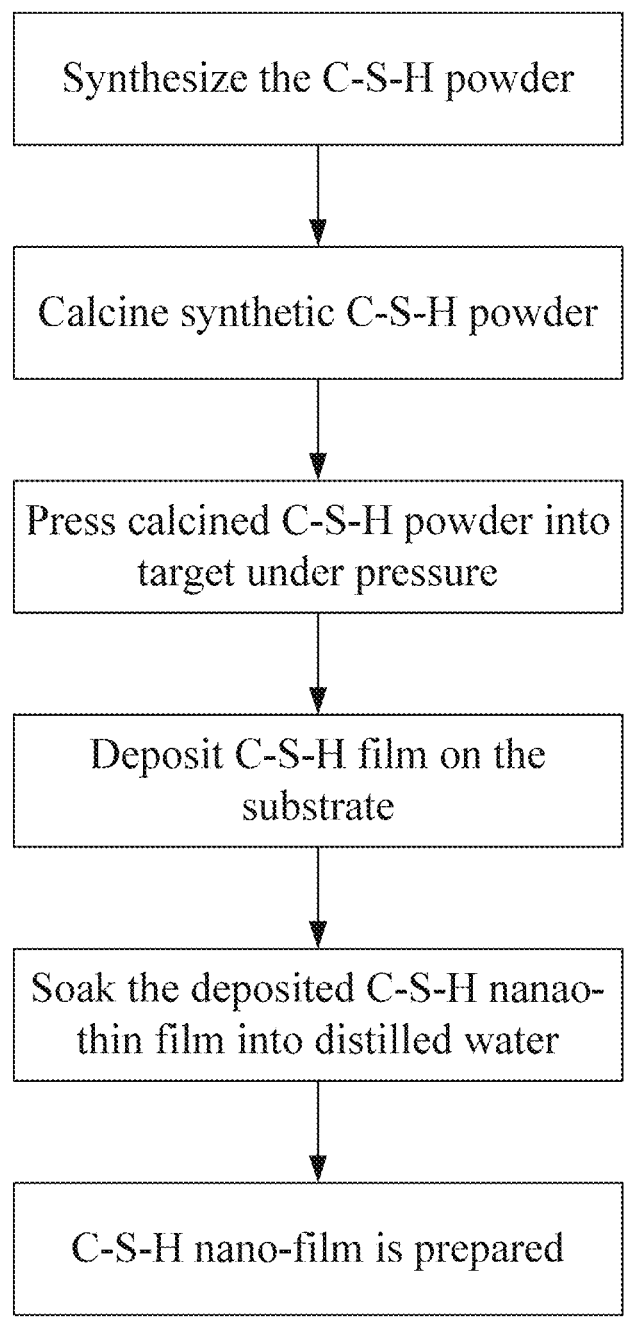
FIG. 5 is a flow diagram showing a method of preparing a C—S—H nano-film by means of magnetron sputtering as taught in the disclosure.

To further illustrate, embodiments detailing a method of preparing a hydrated calcium silicate (C—S—H) nano-film are described below. It should be noted that the following embodiments are intended to describe and not to limit the disclosure.

A method of preparing a C—S—H nano-film comprises the following steps:

1) synthesizing a hydrated calcium silicate (C—S—H) powder having a calcium to silicon ratio (Ca/Si) of 0.5-3.0;
2) calcining the C—S—H powder obtained in 1) for 2-3 hours under a temperature of 150-250° C., cooling to approximately 25° C., and pressing the C—S—H powder under a pressure of 100-200 megapascal, to yield a target material having a diameter of between 50 and 60 mm and a thickness of between 4 and 6 mm;
3) fixing a substrate on a sample table of a magnetron sputtering apparatus, placing the target material obtained in 2) in a target position of the magnetron sputtering apparatus, maintaining a relative distance between the substrate and the target material to 2-10 cm; evacuating a sputtering chamber of the magnetron sputtering apparatus to a pressure of not more than $10^{-3}$ pascal, injecting argon or helium to the sputtering chamber, wherein a flow rate of the argon or helium is controlled to be 10-100 sccm to keep the pressure in the sputtering chamber at 0.5-2.5 pascal; setting a magnetron sputtering power to 50-200 W, pre-sputtering the target material for 5-10 minutes, turning on a rotation system of the sample table and rotating the substrate at a constant speed, sputtering the target material for 30-300 minutes, to yield a nano-film;
4) soaking the nano-film obtained in 3) into in a saturated aqueous solution of calcium hydroxide at approximately 25° C. for 1-3 days, to yield a hydrated calcium silicate nano-film.

The preparation method described in certain embodiments of the disclosure can adjust the size of the C—S—H nano-film by adjusting the sputtering power, sputtering time, substrate size and distance between the substrate and the target material. During the magnetron sputtering process, no impurity is introduced, and the deposition rate of C—S—H on the substrate is stable, the nano-films prepared are homogeneous and pure, which makes it can be conveniently used for subsequent experiments, including the observation of morphology and the measurement of various mechanical properties.

In one embodiment, the C—S—H powder in 1) has a formula of $(CaO)x.SiO_2.H_2O$, in which x ranges from 0.5 to 3.0.

In one embodiment, in 2), the C—S—H powder is calcined under a temperature of 200° C. for 2.5 hours.

In one embodiment, in 2), the C—S—H powder is pressed under a pressure of 150 megapascal to yield the target material; in 3), the substrate comprises glass, silicon, metal or metal oxide; the relative distance between the substrate and the target material is 5 cm; the flow rate of the argon or helium is 50 sccm; the pressure of the sputtering chamber is 1.5 pascal; the magnetron sputtering power is 150 W; a pre-sputtering time of the target material is 8 minutes; and a sputtering time of the target material is 150 minutes.

In one embodiment, in 4), the nano-film prepared in 3) is immersed in the saturated aqueous solution of calcium hydroxide at 25° C. for 2 days.

EXAMPLE 1

The method of preparing a C—S—H nano-film by means of magnetron sputtering is carried out according to the following steps.

1. Synthesize the C—S—H powder with calcium to silicon ratio of 0.5.
2. The synthetic C—S—H powder is calcined for 2.0 hours under the condition of 150° C., then cool the powder to room temperature (25° C.).
3. The powder obtained in the last step is pressed into target under the condition of 100 megapascal.
4. Adjust the distance between the substrate and the target to 2 cm.
5. Evacuate the chamber and keep the pressure within the chamber under $5.0\times10^{-4}$ Pa
6. The flow rate of argon is set to 10 sccm, and the pressure within the chamber is ensured around 0.5 pascal.
7. The magnetron sputtering power is set to 55 W, and start pre-sputtering, pre-sputtering time is 5 minutes.
8. Start depositing C—S—H film on the substrate, the duration of the process is 120 minutes. During the process, the substrate maintains a uniform rotation.
9. Soak the C—S—H nano-film into distilled water at room temperature for 1 days.

EXAMPLE 2

The method of preparing a C—S—H nano-film by means of magnetron sputtering is carried out according to the following steps.

1. Synthesize the C—S—H powder with calcium to silicon ratio of 1.5.
2. The synthetic C—S—H powder is calcined for 3 hours under the condition of 175° C., then cool the powder to room temperature (25° C.).
3. The powder obtained in the last step is pressed into target under the condition of 200 megapascal.
4. Adjust the distance between the substrate and the target to 4 cm.
5. Evacuate the chamber, and keep the pressure within the chamber under $5.0\times10^{-4}$ Pa.
6. The flow rate of argon is set to 20 sccm, and the pressure within the chamber is ensured around 1.5 pascal.
7. The magnetron sputtering power is set to 100 W, and start pre-sputtering, pre-sputtering time is 5 minutes.
8. Start depositing C—S—H film on the substrate, the duration of the process is 30 minutes. During the process, the substrate maintains a uniform rotation.
9. Soak the C—S—H nano-film into distilled water at room temperature for 2 days.

EXAMPLE 3

The method of preparing a C—S—H nano-film by means of magnetron sputtering is carried out according to the following steps.

1. Synthesize the C—S—H powder with calcium to silicon ratio of 2.0.
2. The synthetic C—S—H powder is calcined for 2.0 hours under the condition of 200° C., then cool the powder to room temperature (25° C.).
3. The powder obtained in the last step is pressed into target under the condition of 150 megapascal.
4. Adjust the distance between the substrate and the target to 5 cm.

5. Evacuate the chamber, and keep the pressure within the chamber under 1.0×10⁻⁴ Pa.

6. The flow rate of argon is set to 50 sccm, and the pressure within the chamber is ensured around 1.5 pascal.

7. The magnetron sputtering power is set to 150 W, and start pre-sputtering, pre-sputtering time is 8 minutes.

8. Start depositing C—S—H film on the substrate, the duration of the process is 150 minutes. During the process, the substrate maintains a uniform rotation.

9. Soak the C—S—H nano-film into distilled water at room temperature for 2 days.

EXAMPLE 4

The method of preparing a C—S—H nano-film by means of magnetron sputtering is carried out according to the following steps.

1. Synthesize the C—S—H powder with calcium to silicon ratio of 2.0.

2. The synthetic C—S—H powder is calcined for 2.0 hours under the condition of 150° C., then cool the powder to room temperature (25° C.).

3. The powder obtained in the last step is pressed into target under the condition of 175 megapascal.

4. Adjust the distance between the substrate and the target to 8 cm.

5. Evacuate the chamber, and keep the pressure within the chamber under 1.0×10⁻⁴ Pa.

6. The flow rate of argon is set to 10 sccm, and the pressure within the chamber is ensured around 2.5 pascal.

7. The magnetron sputtering power is set to 200 W, and start pre-sputtering, pre-sputtering time is 8 minutes.

8. Start depositing C—S—H film on the substrate, the duration of the process is 300 minutes. During the process, the substrate maintains a uniform rotation.

9. Soak the C—S—H nano-film into distilled water at room temperature for 3 days.

EXAMPLE 5

The method of preparing a C—S—H nano-film by means of magnetron sputtering is carried out according to the following steps.

1. Synthesize the C—S—H powder with calcium to silicon ratio of 3.0.

2. The synthetic C—S—H powder is calcined for 2.0 hours under the condition of 250° C., then cool the powder to room temperature (25° C.).

3. The powder obtained in the last step is pressed into target under the condition of 200 megapascal.

4. Adjust the distance between the substrate and the target to 10 cm.

5. Evacuate the chamber, and keep the pressure within the chamber under 1.0×10⁻⁴ Pa.

6. The flow rate of argon is set to 10 sccm, and the pressure within the chamber is ensured around 2.5 pascal.

7. The magnetron sputtering power is set to 250 W, and start pre-sputtering, pre-sputtering time is 10 minutes.

8. Start depositing C—S—H film on the substrate, the duration of the process is 300 minutes. During the process, the substrate maintains a uniform rotation.

9. Soak the C—S—H nano-film into distilled water at room temperature for 3 days.

It will be obvious to those skilled in the art that changes and modifications may be made, and therefore, the aim in the appended claims is to cover all such changes and modifications.

What is claimed is:

1. A method, comprising:
   1) synthesizing a hydrated calcium silicate (C—S—H) powder having a calcium to silicon ratio (Ca/Si) of 0.5-3.0;
   2) calcining the C—S—H powder obtained in 1) for 2-3 hours under a temperature of 150-250° C., cooling to approximately 25° C., and pressing the C—S—H powder under a pressure of 100-200 megapascal, to yield a target material having a diameter of between 50 and 60 mm and a thickness of between 4 and 6 mm;
   3) fixing a substrate on a sample table of a magnetron sputtering apparatus, placing the target material obtained in 2) in a target position of the magnetron sputtering apparatus, maintaining a distance between the substrate and the target material to 2-10 cm; evacuating a sputtering chamber of the magnetron sputtering apparatus to a pressure of not more than 10⁻³ pascal, injecting argon or helium into the sputtering chamber, wherein a flow rate of the argon or helium is controlled to be 10-100 sccm to keep the pressure in the sputtering chamber at 0.5-2.5 pascal; setting a magnetron sputtering power to 50-200 W, pre-sputtering the target material for 5-10 minutes, turning on a rotation system of the sample table and rotating the substrate at a constant speed, sputtering the target material for 30-300 minutes, to yield a nano-film; and
   4) soaking the nano-film obtained in 3) in a saturated aqueous solution of calcium hydroxide at approximately 25° C. for 1-3 days, to yield a hydrated calcium silicate nano-film.

2. The method of claim 1, wherein the C—S—H powder in 1) has a formula of $(CaO)x \cdot SiO_2 \cdot H_2O$, in which x ranges from 0.5 to 3.0.

3. The method of claim 1, wherein in 2), the C—S—H powder is calcined under a temperature of 200° C. for 2.5 hours.

4. The method of claim 1, wherein in 2), the C—S—H powder is pressed under a pressure of 150 megapascal to yield the target material; in 3), the substrate comprises glass, silicon, metal or metal oxide; the distance between the substrate and the target material is 5 cm; the flow rate of the argon or helium is 50 sccm; the pressure of the sputtering chamber is 1.5 pascal; the magnetron sputtering power is 150 W; a pre-sputtering time of the target material is 8 minutes; and a sputtering time of the target material is 150 minutes.

5. The method of claim 1, wherein in 4), the nano-film prepared in 3) is immersed in the saturated aqueous solution of calcium hydroxide at 25° C. for 2 days.

\* \* \* \* \*